(12) United States Patent
Kim

(10) Patent No.: US 6,352,888 B1
(45) Date of Patent: Mar. 5, 2002

(54) METHOD OF FABRICATING SRAM CELL HAVING A FIELD REGION

(75) Inventor: Dong Sun Kim, Seoul (KR)

(73) Assignee: Hyundai Electronics Industries Co., Ltd., Kyoungki-Do (KW)

( * ) Notice: Subject to any disclaimer, the term of this patent is extended or adjusted under 35 U.S.C. 154(b) by 0 days.

(21) Appl. No.: 09/478,490

(22) Filed: Jan. 6, 2000

Related U.S. Application Data

(60) Division of application No. 08/980,025, filed on Nov. 26, 1997, now Pat. No. 6,028,340, which is a continuation-in-part of application No. 08/499,990, filed on Jul. 10, 1995, now Pat. No. 6,127,705.

(30) Foreign Application Priority Data

Dec. 28, 1996 (KR) .............................. 96-75049

(51) Int. Cl.$^7$ .................. H01L 21/8234; H01L 21/8244
(52) U.S. Cl. ..................... 438/238; 438/381; 438/382
(58) Field of Search .............................. 438/238, 381, 438/142, 382, 585–587

(56) References Cited

U.S. PATENT DOCUMENTS

| 5,354,704 A | 10/1994 | Yang et al. ............... 437/52 |
| 5,366,918 A | 11/1994 | Yang ............................ 437/52 |
| 5,379,251 A | 1/1995 | Takeda et al. ............... 365/174 |
| 5,461,251 A | 10/1995 | Yang et al. ................. 257/379 |
| 5,721,166 A * | 2/1998 | Huang et al. ............... 438/238 |
| 6,127,705 A | 10/2000 | Kim ............................ 257/368 |

FOREIGN PATENT DOCUMENTS

| JP | 3-218667 | 9/1991 |
| JP | 6-350053 | 12/1994 |
| JP | 7-169856 | 7/1995 |
| JP | 8-181285 | 7/1996 |

\* cited by examiner

*Primary Examiner*—Tom Thomas
*Assistant Examiner*—Craig P. Lytle
(74) *Attorney, Agent, or Firm*—Morgan, Lewis & Bockius LLP

(57) ABSTRACT

A static random access memory (SRAM) cell includes first and second load devices, first and second access transistors, first and second drive transistors, and two bit lines. The SRAM includes a substrate; an active region in the substrate, the active region being formed in a direction; gate electrodes of the first and second access transistors crossing the active region, the gate electrodes of the first and second access transistors are parallel with each other; gate electrodes of the first and second drive transistors crossing the active region, the gate electrodes of the first and second drive transistors are parallel with each other; and first and second load devices on the gate electrodes of the first and second access transistors, the first and second load devices are parallel with each other.

10 Claims, 8 Drawing Sheets

METHOD OF FABRICATING SRAM CELL HAVING A FIELD REGION

This is a divisional application Ser. No. 08/980,025 filed on Nov. 26, 1997 now U.S. Pat. No. 6,028,340.

This application is a continuation-in-part of application of application Ser. No. 08/499,990, filed on Jul. 10, 1995 now U.S. Pat. No. 6,127,705, which is hereby incorporated by reference. Also, this application claims the benefit of Korean Application No. 75049/1996 filed on Dec. 28, 1996, which is hereby incorporated by reference.

BACKGROUND OF THE INVENTION

1. Field of the Invention

The present invention relates to a semiconductor memory device, and more particularly, to a construction of a static random access memory (hereinafter SRAM) cell and the fabrication method thereof.

2. Discussion of the Related Art

FIGS. 1 and 2 are plan views showing a layout of an SRAM cell according to the conventional art. As shown in FIG. 1, the conventional SRAM cell includes a plurality of active regions 93,94,96 and a polysilicon line 95, a polysilicon interconnection line I2 and a word line 97 formed on the active region 93,94. A transistor TPA is formed between the active region 96 and the polysilicon line 95. A first node (N1) is formed between the active region 93 and the polysilicon line 95, and a second node (N2) connects the active region 96 and a line I2. A transistor TPB is formed at the crossed point of the line I2 and the active region 93. The first node (N1) is formed at the point where the end of the line 95 crosses a mid portion of the active region 93. A transistor (T1) is formed where the active region 93 crosses the word line 97. At the active region 93 formed between the transistor TPB and the transistor T1 is an interconnection line I1 formed of an active layer material. One end of the word line 97 and the transistor (T2) are crossed in the active region 94. The transistors (TPA,TPB) are generally called drive transistors, and the transistors (T1,T2) are commonly called access transistors.

FIG. 2 is a plan view showing a layout of a split word line cell according to the conventional art. Referring to FIG. 2, the conventional SRAM cell having a split word line cell includes a plurality of active regions 90,91, polysilicon lines (N1,N2), and word lines (WL1,WL2) formed on the active regions 90,91. A transistor (T1) is formed where the line (N1) and the active region 90 crosses each other, and a transistor (T3) is formed where the word line (WL1) and the active region 90 crosses. A transistor (T4) is formed where the active region 91 and the word line (WL2) crosses each other.

In the SRAM cell of FIG. 2, local interconnection lines (I1,I2) are defined by a buried N+ line. A common drain of the transistors (T1,T3) and a gate of the transistor (T2) are electrically connected by the local interconnection line (I1). A common drain of the transistors (T4,T2) and a gate of the transistor (T1) are electrically connected by the local interconnection line (I2).

In the SRAM cell of FIG. 1, the active diffusion region 93 and the polysilicon line (I2) are used for the connection of the two nodes (N1,N2). The active diffusion region 93 and the polysilicon line (I2) each have different resistance values. Since the polysilicon and the diffusion region have each different resistances, and different line lengths, the SRAM cell is in an asymmetrical condition, which means that the local interconnection lines (I1,I2) of the conventional SRAM of FIG. 1 are defined as different layers. That is, one is an N+ diffusion layer, and the other is a polysilicon deposition layer. The two are composed of different materials. Thus, the resistances of the nodes (N1,N2) are different, which causes the cell to be more unstable and different currents to flow in the transistors (T1,T2). Accordingly, the cell is asymmetrical when the transistors are turned on.

Moreover, the conventional SRAM cell of FIG. 1 has a small cell size, but the cells are formed asymmetrically having a 45° layout. Therefore, resolution is not good in a super high resolution illumination control (SHRINK), a lithography, or a phase inversion mask. Also, a metal design rule becomes tight. In addition, a plurality of active regions 93,94,96 (FIG. 1) in the SRAM cell increases the cell size and requires a plurality of contact holes to be formed during the wiring of ground lines. As a result, the ground resistance value of each drive transistor is made different.

In the conventional split word line cell shown in FIG. 2, each interconnection line (I1,I2) is defined as a diffusion layer formed of an identical material and an identical layer to improve the asymmetry problem of the SRAM cell shown in FIG. 1. However, since the SRAM cell has a plurality of active regions 90,91, the cell size occupies a large area and a plurality of contact holes must be formed when wiring a ground line, resulting in a different ground resistance values for each drive transistor.

SUMMARY OF THE INVENTION

Accordingly, the present invention is directed to a static random access memory cell that substantially obviates one or more of the problems due to limitations and disadvantages of the related art.

An object of the present invention is to provide an SRAM cell having a plurality of interconnection lines formed of substantially identical material and layer.

Another object of the present invention is to provide an SRAM cell having a single active region.

Another object of the present invention is to provide an SRAM cell having drive transistors with identical ground resistance.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an SRAM cell includes a semiconductor substrate, an active region formed in the semiconductor substrate, each gate line of first and second access transistors formed to cross the active region and parallel to each other, each gate line of first and second drive transistors formed between the gate lines of the first and second access transistors to be parallel to the gate lines thereof, a plurality of impurity regions formed in the active region at both sides of each four gate lines, and a ground power source line electrically connected to the impurity region corresponding to the space between the gate lines of the first and second drive transistors.

The active region is formed to be diagonally symmetrical in tiers, and the ground power source line is formed in parallel with the gates in a different layer.

In another aspect of the present invention, a method for fabricating the SRAM cell includes the steps of sequentially forming an insulating film and a first conductive layer on a semiconductor substrate; forming first through fourth gate lines crossed with an active region in parallel with each other by selectively etching the first conductive layer and the insulating film; forming first through fifth impurity regions by implanting an ion impurity into the active region using the four gate lines as a mask; forming a first contact hole so that the surface of the second impurity region formed between the first and second gate lines is exposed, a second contact hole so that the surface of the third gate line is exposed, a third contact hole so that the surface of the fourth impurity region formed between the third and fourth gate lines is exposed, and a fourth contact hole so that the surface of the second gate line is exposed, by forming a first insulating film on the semiconductor substrate including the active region and the four gate lines and selectively etching the first insulating film; forming a first conductive line filling the first and second contact holes and a second conductive line filling the third and fourth contact holes to be parallel with each other and to be perpendicular with the four gate lines after forming and patterning an undoped polysilicon layer on the first insulating film; implanting a conductive impurity into the space between first and second contact holes among the first conductive line and the space between the third and fourth contact holes among the second conductive lines; forming fifth and sixth contact holes to expose a predetermined portion where an impurity ion is not implanted among the first and second conductive lines and a seventh contact hole to expose the third impurity corresponding to the space between the second and third gate lines, by forming a second insulating film on the first insulating film including the first and second conductive lines and selectively etching the second insulating film; and forming first and second power source lines filled in the fifth and sixth contact holes and perpendicular to the first and second conductive lines to be parallel with each other, and a ground power source line filled in the seventh contact hole and parallel with the power source lines by forming and patterning a second conductive layer to fill the fifth through seventh contact holes formed on the second insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

The SRAM cell and the fabrication method thereof according to the present invention will now be described in detail with reference to the accompanying drawings.

Figure 1:
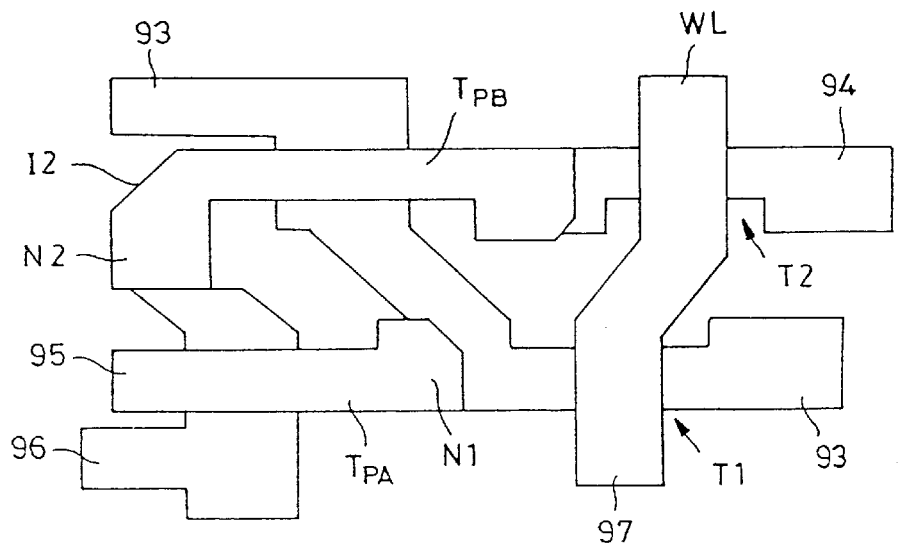
FIG. 1 is a plan view showing a layout of an SRAM cell according to the conventional art.
Figure 2:
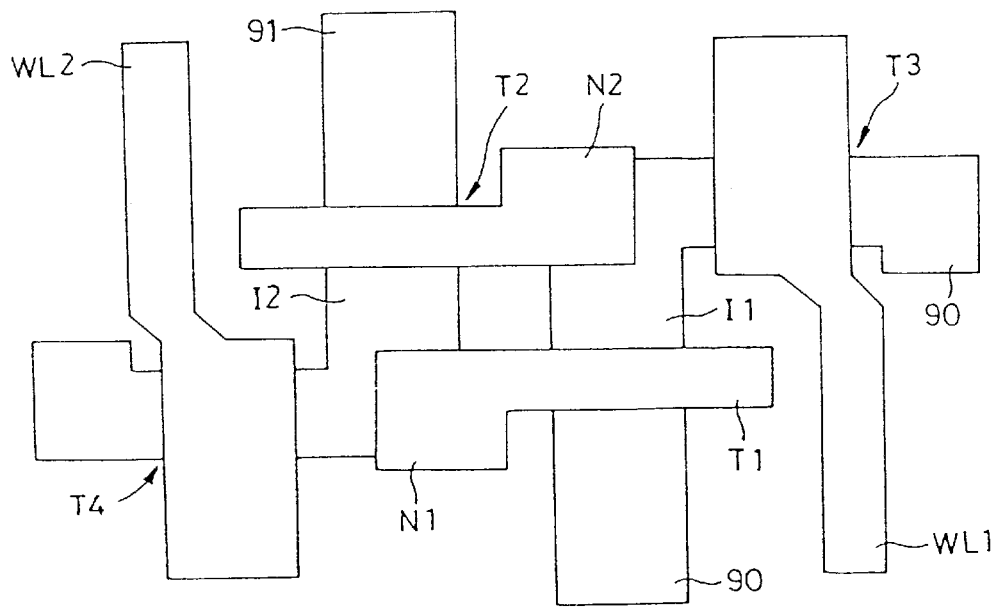
FIG. 2 is a plan view showing a layout of a split word line cell according to the conventional art.
Figure 3A:
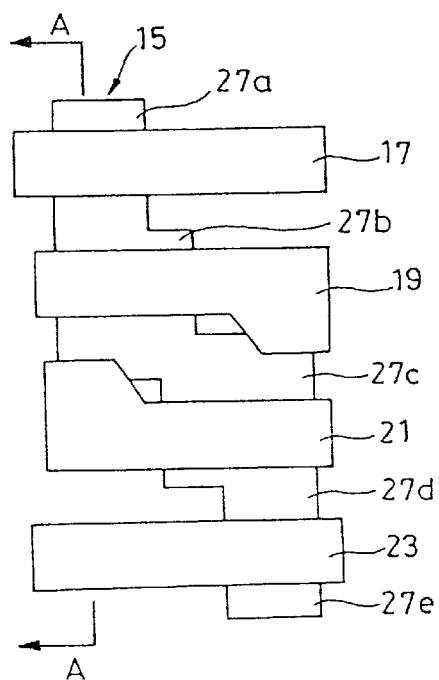
FIGS. 3A through 3G are plan views showing sequential layouts for fabricating an SRAM cell according to the present invention.
Figure 4A:
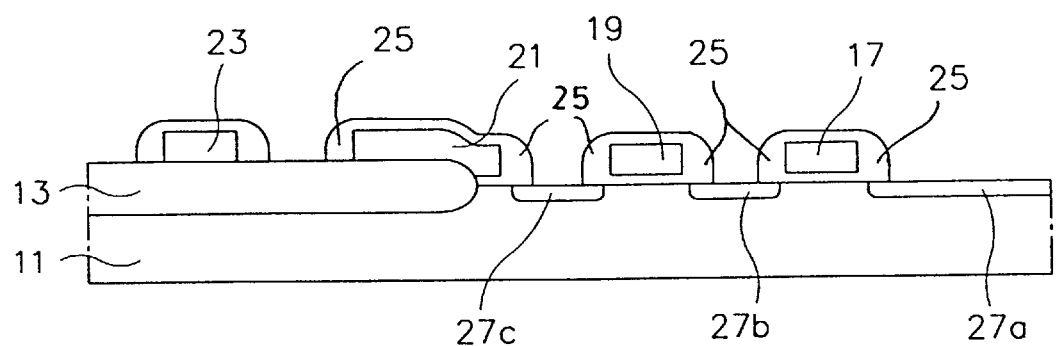
FIGS. 4A through 4F are cross-sectional views taken along the line I—I of FIGS. 3A through 3G.

Referring to FIGS. 3A and 4A, a single active region 15 is formed on a semiconductor substrate 11. The active region 15 is diagonally symmetrical with respect to an axis corresponding to a field region 13. A gate oxide film (not illustrated) is formed on the active region 15. On the entire structure, a first conductive layer preferably formed of a polysilicon is deposited and patterned to form first through fourth gate lines 17,19,21,23. The gate lines are sequentially formed in parallel with each other and cross the active region 15. Then, a low concentration conductive impurity is ion-implanted in the active region 15 to form a side wall 25 preferably formed of an oxide film on each side of each gate line 17,19,21,23. A high concentration conductive impurity is ion-implanted in the active region 15 to form high concentration impurity regions 27a, 27b, 27c, 27d, 27e having a lightly doped region formed on each side of each gate line 17,19,21,23 of the active region 15. Thus, source and drain regions of each gate Line 17,19,21,23 are formed. When the ion implantation process is carried out, the gate lines 17,19,21,23 serve as masks to form source/drain regions at both sides of each gate line. Here, reference numeral 27a denotes a source region of the first gate line 17, 27b denotes a common drain region of the first and second gate lines 17, 19, 27c denotes a common source region of the second and third gate lines 19,21,27d denotes a common drain region of the third and fourth gate lines 21,23, and 27e denotes a source region of the fourth gate line 23.

Figure 3B:
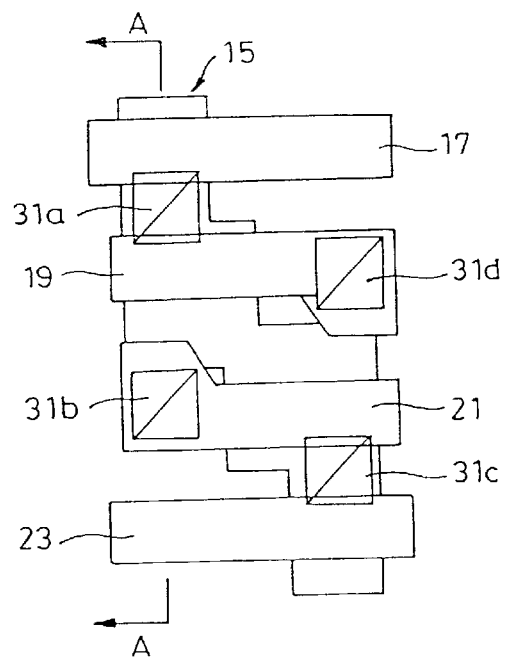
Figure 4B:
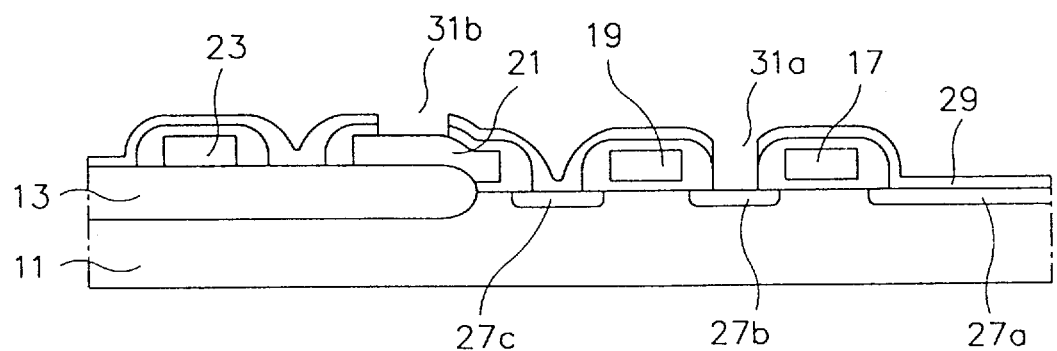

Then, as shown in FIGS. 3B and 4B, on the entire resultant structure, a first insulating film 29 is deposited and then patterned to form first through fourth contact holes 31a,31b,31c,31d. The first contact hole 31a is formed so that the surface of the impurity region 27b formed between the first and second gate lines 17,19 is exposed. The second contact hole 31b is formed so that the surface of the third gate line 21 is exposed. The third contact hole 31c is formed so that the surface of the impurity region 27d formed between the third and fourth gate lines 21,23 is exposed. The fourth contact hole 31d is formed so that the surface of the second gate line 19 is exposed.

Figure 3C:
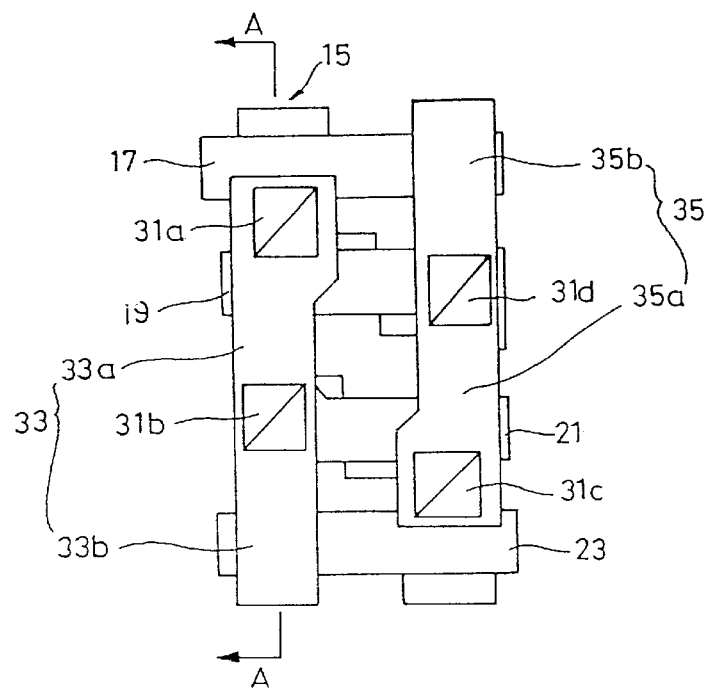
Figure 4C:
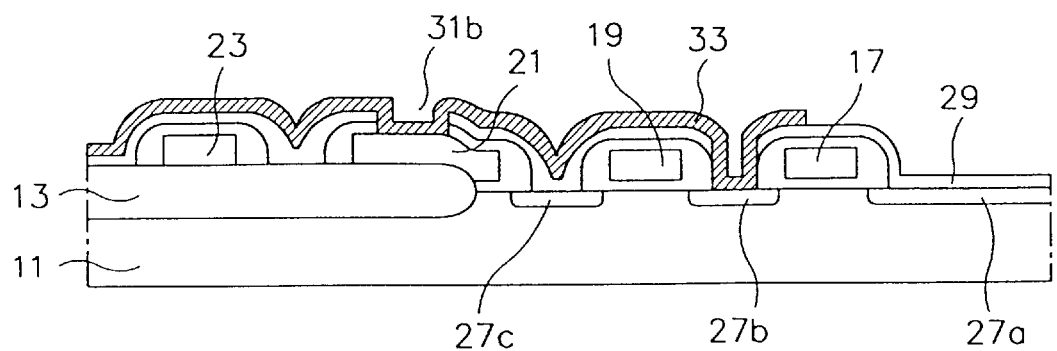

Next, as shown in FIGS. 3C and 4C, on the entire resultant structure, a conductive material such as an undoped polysilicon is deposited and patterned to fill the first and second contact holes 31a,31b and form a first conductive line 33. The first conductive line crosses the second through fourth gate lines 19,21,23. The conductive material also fills the third and fourth contact holes 31c,31d and forms a second conductive line 35 crossing the upper portions of the first, second, and third gate lines 17,19,21. The second conductive line 35 is parallel to the first conductive line 33. In particular, the first conductive line 33 electrically connects the common impurity region 27b (node N1 of FIG. 5) formed between the first and second gate lines 17,19 to the third gate line 21. The second conductive line 35 electrically connects the common impurity region 27d (node N2 of FIG. 5) formed between the third and fourth gate lines 21,23 to the second gate line 19.

Figure 5:
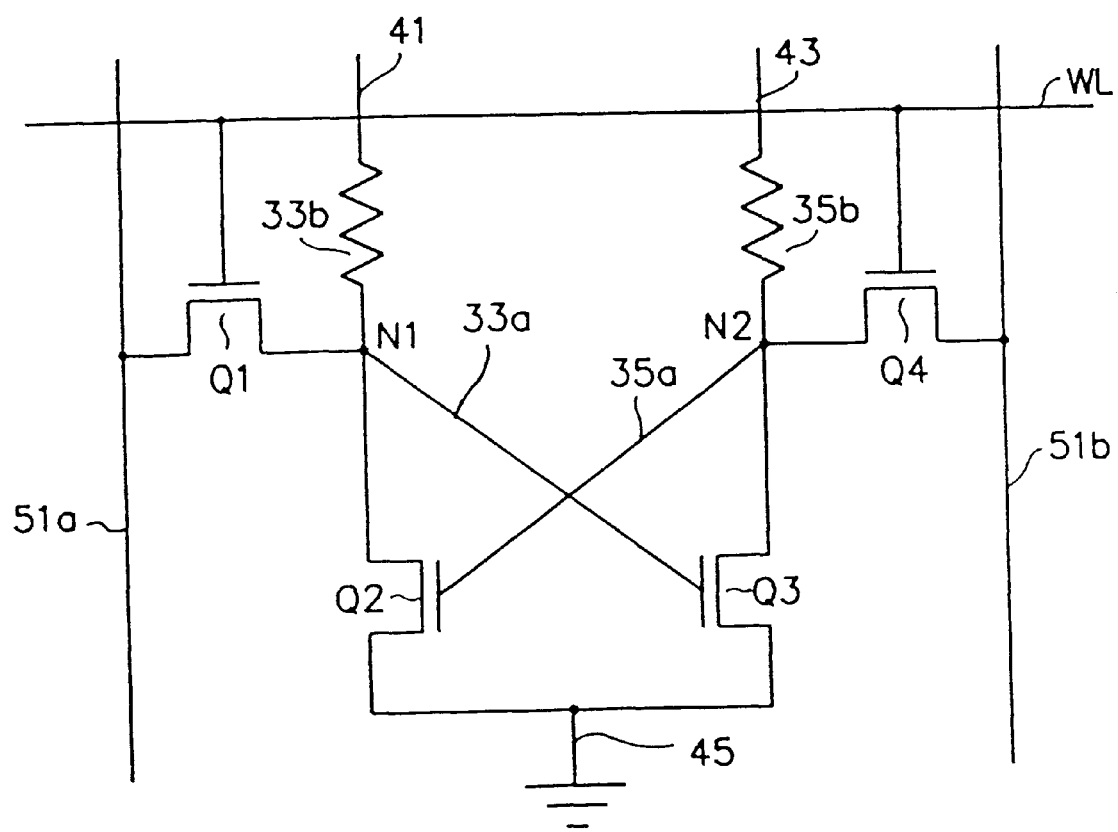
FIG. 5 is an equivalent circuit diagram of an SRAM cell according to the present invention.

Then, on the entire resultant structure, a photoresist film (not illustrated) is formed and patterned. The photoresist film is patterned such that the upper surface of the portion electrically connecting the common impurity region 27b and the third gate line 21 is exposed along the first conductive line 33, and the upper surface of the portion electrically connecting the common impurity region 27d and the second gate line 19 is exposed along the second conductive line 35. Then, using the patterned photoresist film as a mask, ions are implanted into the exposed portion of the first and second conductive lines 33, 35, to lower the resistance value of the exposed portion and increase the conductivity thereof. Then, the photoresist film is removed. First and second interconnection lines 33a, 35a shown in FIG. 5 are defined by the ion-implanted portion along the conductive lines 33, 35. Also, first and second load devices 33b, 35b are defined by the undoped portion where ions are not implanted.

Figure 3D:
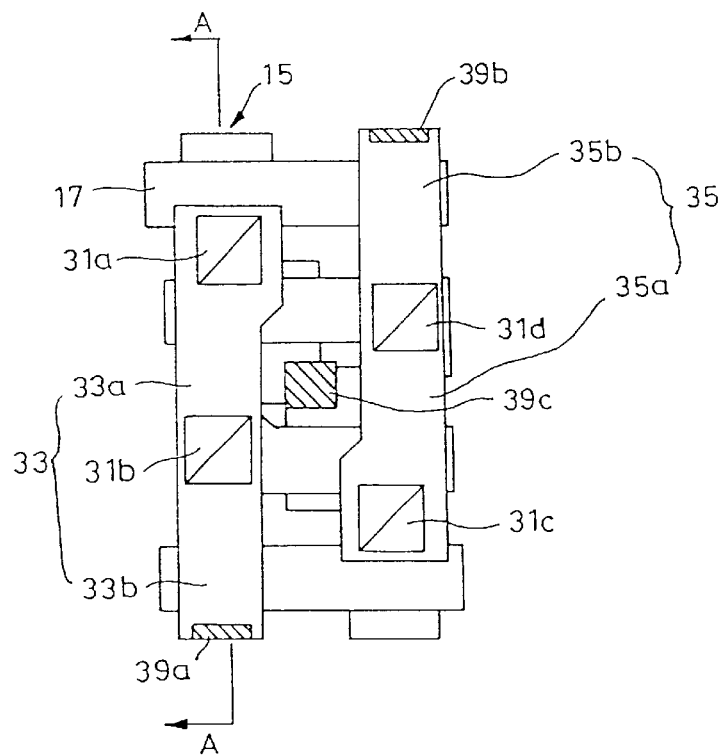
Figure 3E:
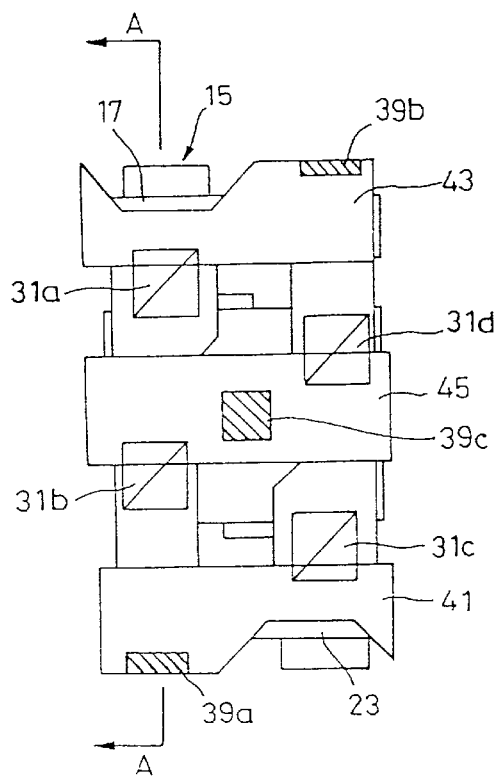
Figure 4D:
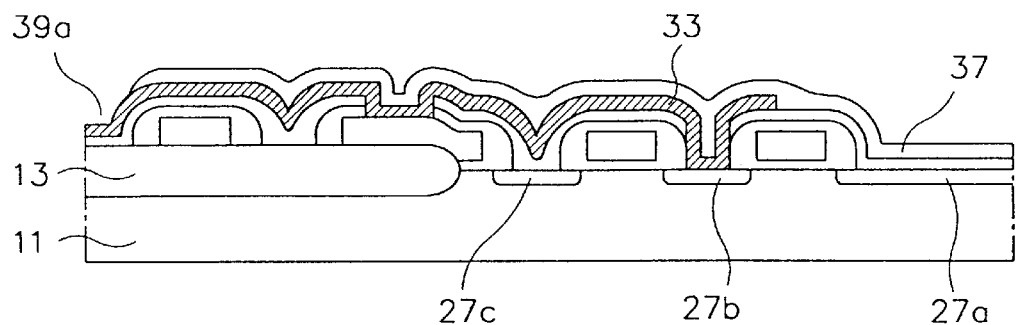

As shown in FIGS. 3D and 4D, on the entire resultant structure, a second insulating film 37 is deposited and patterned to form fifth through seventh contact holes 39a, 39b,39c. The fifth contact hole 39a, as shown in FIG. 3E, is formed so that the upper surface of the first load device 33b (an undoped region along the first conductive line 33) is exposed to the outside. The sixth contact hole 39b is formed so that the upper surface of the second load device 35b (an undoped region along the second conductive line 35) is exposed to the outside. The seventh contact hole 39c is formed so that the upper surface of the mid portion of the common impurity region 27c between the second and third gate lines 19,21 is exposed.

Figure 4E:
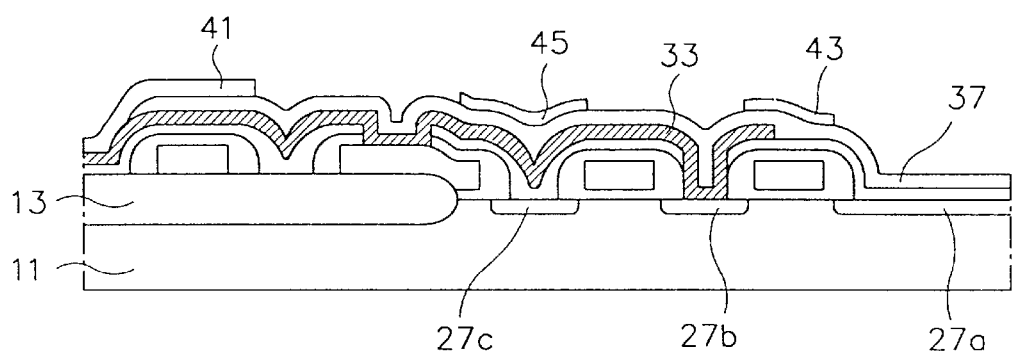

Then, as shown in FIGS. 3E and 4E, on the entire resultant structure, a second conductive layer is deposited and patterned to fill the fifth contact hole 39a and form a third conductive line 41 (first power source line) crossing a portion of the ends of the first and second conductive lines 33,35. The second conductive layer fills the sixth contact hole 39b and forms a fourth conductive line 43 (second power source line) crossing a portion of the other ends of the first and second conductive lines 33,35. The second conductive layer also fills the seventh contact hole 39c and forms a fifth conductive line 45 (ground power source line) parallel with the third and fourth conductive lines 41,43.

When the power source lines 41,43 are formed, portions where the contacts of the bit line and bit line bars are to be formed, respectively, are defined, as shown by the notches on the third and fourth conductive lines. Moreover, the power source lines 41,43 and the ground power source line 45 are preferably formed parallel to each other on an identical layer.

Figure 3F:
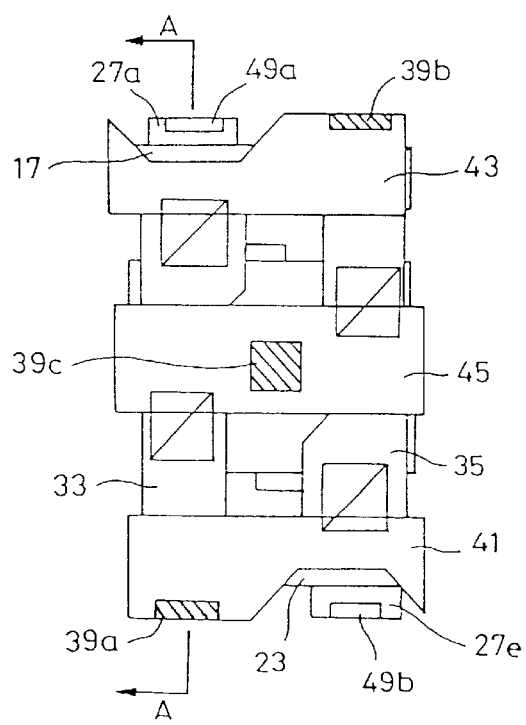
Figure 4F:
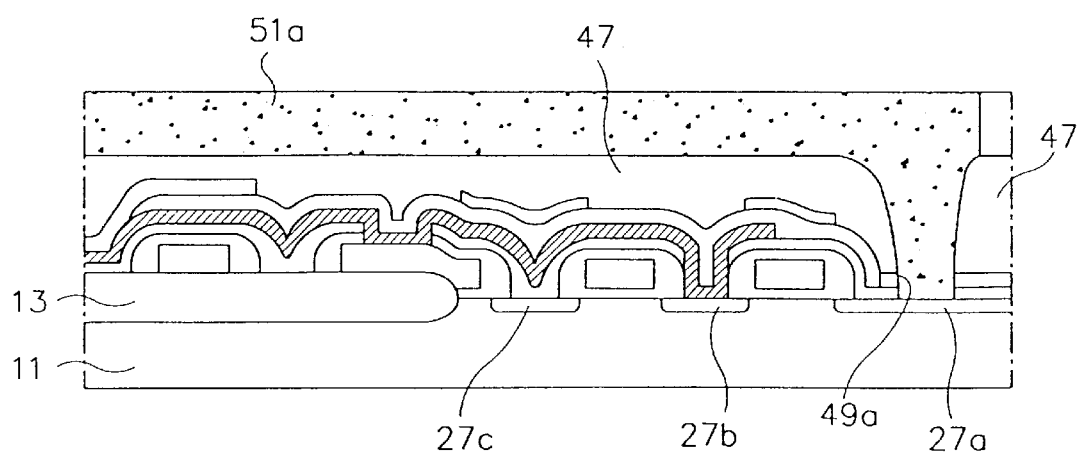

Then, as shown in FIGS. 3F and 4F, on the entire resultant structure, an insulating film 47 (for planarization) is deposited and patterned to form eighth and ninth contact holes 49a,49b. The eighth contact hole 49a is formed such that the surface of the source region 27a of the first gate line 17 is exposed, and the ninth contact hole 49b is formed such that the surface of the source region 27e of the fourth gate line 23 is exposed.

Figure 3G:
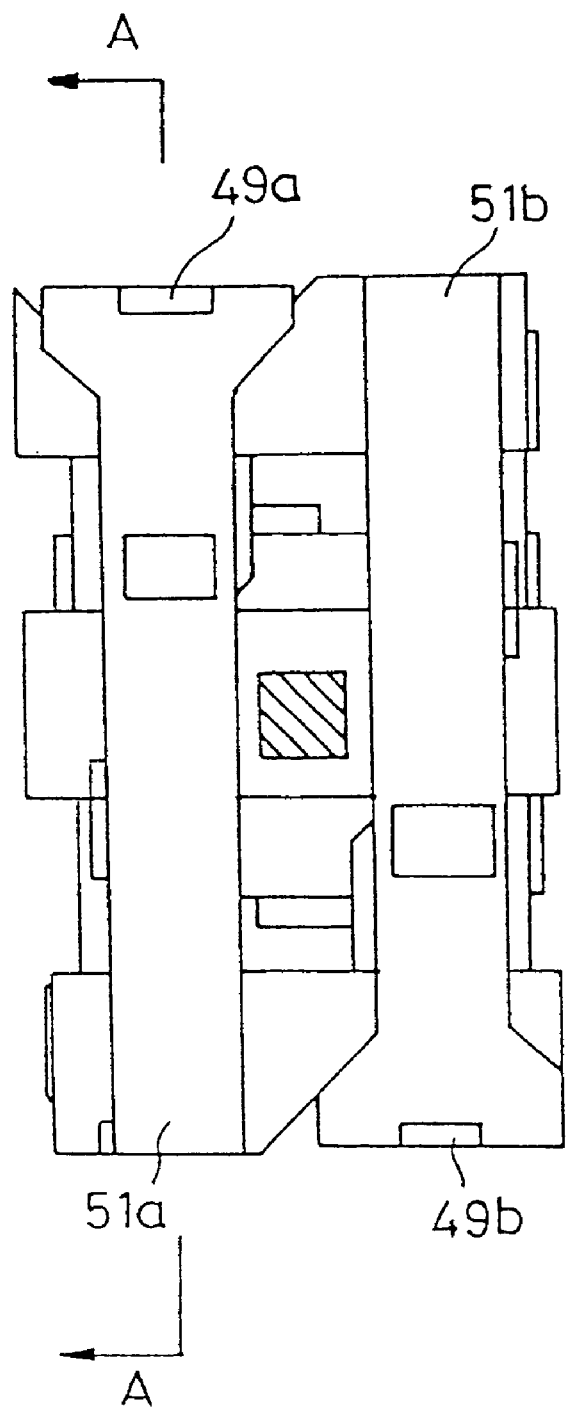

Then, as shown in FIGS. 3G and 4F, on the entire structure, a third conductive layer 51 is deposited and patterned to form a sixth conductive line 51a (a bit line, B) and a seventh conductive line 51b (a bit line bar, B). The sixth conductive line 51a (the bit line) is electrically connected to the source region 27a of the first gate line 17 through the eighth contact hole 49a, and formed to cross an upper portion of the power source lines 41,43 and the ground power source line 45. The seventh conductive line 51b (the bit line bar) is electrically connected to the source region 27e of the fourth gate line 23 through the ninth contact hole 49b and preferably formed parallel with the sixth conductive line 51a on the identical layer.

FIG. 5 is an equivalent circuit diagram of the SRAM cell according to the present invention. Referring to FIG. 5, the circuit includes four transistors and two load devices. The four transistors include first through fourth transistors Q1,Q2,Q3,Q4 corresponding to the first through fourth gate lines shown in FIGS. 3 and 4. The first transistor (Q1) and the second transistor (Q2) have a common drain region (27b of FIG. 3). The second transistor (Q2) and the third transistor (Q3) have a common source region (27c). The third transistor (Q3) and the fourth transistor (Q4) have a common drain region (27d). The second and third transistors (Q2,Q3) are drive transistors, and the first and fourth transistors (Q1,Q4) are access transistors.

In addition, in FIG. 5, a conductive metal line such as a doped polysilicon is used as local interconnection lines 33a,35a for the SRAM according to the present invention. As shown in FIGS. 3 and 4, the local interconnection lines 33a,35a are the upper portions the gate lines 19,21 of each drive transistor (Q2,Q3) and of the gate lines 17,23 of each access transistor (Q1,Q4). The second local interconnection line 35a electrically connects the gate line 19 of the second transistor (Q2) and the node (N2) (that is, the common drain 27d of the third and fourth transistors (Q3,Q4)). The first local interconnection line 33a electrically connects the gate line 21 of the third transistor (Q3) and the node (N1) (that is, the common drain 27b of the first and second transistors (Q1,Q2)). The first and second load devices 33b,35b are respectively connected between the nodes (N1,N2), and respectively connected to the first and second power source lines 41,43. The ground power source line 45 is connected to the common source 27c of the second and third transistors (Q2,Q3). A word line (WL) is connected to the first and fourth transistors (Q1,Q4). The source region 27a of the first transistor (Q1) is connected to a first data line 51a (a bit line, B), and the source region 27e of the fourth transistor (Q4) is connected to a second data line 51b (a bit line bar, B).

As described in detail above, the semiconductor memory device and the fabrication method thereof according to the present invention have the following advantages. The SRAM can be made symmetrical since the first and second interconnection lines are formed of an identical material on an identical layer. The size of the SRAM cell can be made small since a single active region is embodied. In wiring a ground power source line of a pair of drive transistors, each drive transistor has an identical value of the ground resistance since one common contact hole is used to connect to one ground power source line.

It will be apparent to those skilled in the art that various modifications and variations can be made in the static random access memory cell and fabrication method of the present invention without departing from the spirit or scope of the invention. Thus, it is intended that the present invention cover the modifications and variations of this invention provided they come within the scope of the appended claims and their equivalents.

What is claimed is:

1. A method of fabricating an SRAM cell, the method comprising the steps of:

forming an active region in a substrate, the active region being formed in a direction;

forming a first, second, third, and fourth gate lines, the gate lines crossing the active region and parallel with each other;

forming a plurality of impurity regions in the active region by using the first, second, third, and fourth gate lines as a mask;

forming a first and second load device, the first and second load device being perpendicular to the gate electrodes; and forming a first and second power lines and ground line on the first and second load, the first and second power lines and ground line being parallel with each other and perpendicular to the first and second load devices.

2. The method according to claim 1, further comprising the step of forming a first and second bit lines, the first and second bit lines are parallel with the first and second load devices, respectively.

3. The method according to claim 1, wherein the first and fourth gate lines are gate electrodes of a first and second access transistors, the second and third gate lines are gate electrodes of a first and second drive transistors, respectively.

4. The method according to claim 1, wherein the first, second, third, and fourth gate lines include a doped polysilicon.

5. The method according to claim 1, wherein the first and second load devices include an undoped polysilicon.

6. A method of fabricating an SRAM cell, the method comprising the steps of:

sequentially forming a gate oxide film and a first conductive layer on a semiconductor substrate having an active region;

forming first, second, third and fourth gate lines crossing the active region and substantially parallel with respect to each other by selectively etching the first conductive layer and the gate oxide film;

forming first, second, third, fourth, and fifth impurity regions by implanting impurity ions into the active region using the first, second, third, and fourth gate lines as a mask;

forming a first insulating film on the semiconductor substrate;

forming a first contact hole to expose a surface of the second impurity region formed between the first and second gate lines;

forming a second contact hole to expose a surface of the third gate line;

forming a third contact hole to expose a surface of the fourth impurity region formed between the third and fourth gate lines;

forming a fourth contact hole to expose a surface of the second gate line;

wherein the first, second, third, and fourth contact holes are formed by selectively etching the first insulating film;

forming a first conductive line filling the first and second contact holes and a second conductive line filling the third and fourth contact holes, the first and second conductive lines being formed to be substantially parallel with respect to each other and substantially perpendicular to the first, second, third, and fourth gate lines, the first and second conductive lines being formed by depositing and patterning an undoped polysilicon layer on the first insulating film;

implanting a conductive impurity ion into a first area between the first and second contact holes along the first conductive line and a second area between the third and fourth contact holes along the second conductive line;

forming a second insulating film on the first insulating film including the first and second conductive lines;

forming a fifth and sixth contact holes by selectively etching the second insulating film to expose a predetermined portion of each of the first and second conductive lines where an impurity ion is not implanted;

forming a seventh contact hole by selectively etching the second insulating film to expose the third impurity region corresponding to the space between the second and third gate lines; and forming first and second power source lines substantially parallel with respect to each other and substantially perpendicular to the first and second conductive lines and a ground line substantially parallel with respect to the power source lines by forming and patterning a second conductive layer to fill the fifth, sixth, and seventh contact holes.

7. The method according to claim 6, wherein the active region is formed in a direction.

8. The method according to claim 6, wherein the step of forming the first, second, third, fourth, and fifth impurity regions comprises the steps of:

forming a plurality of low concentration impurity regions in the active region using the first, second, third, and fourth gate lines as a mask;

forming insulating side walls at each side of the first, second, third, and fourth gate lines; and forming a plurality of high concentration impurity regions in the low concentration impurity regions using the first, second, third, and fourth gate lines including the insulating side walls.

9. The method according to claim 6, wherein the first and second conductive layers are formed with a doped polysilicon.

10. The method according to claim 6, further comprising the step of forming bit lines by selectively etching a third conductive layer so as to be connected one terminal of the access transistors.

* * * * *